(12) United States Patent
Jhan et al.

(10) Patent No.: US 12,396,152 B2
(45) Date of Patent: Aug. 19, 2025

(54) SEMICONDUCTOR STRUCTURE AND METHOD FOR FORMING THE SAME

(71) Applicant: Fujian Jinhua Integrated Circuit Co., Ltd., Quanzhou (CN)

(72) Inventors: Yi-Wang Jhan, Quanzhou (CN); Fu-Che Lee, Quanzhou (CN); Gang-Yi Lin, Quanzhou (CN); An-Chi Liu, Quanzhou (CN); Yifei Yan, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 90 days.

(21) Appl. No.: 18/396,747

(22) Filed: Dec. 27, 2023

(65) Prior Publication Data
US 2024/0130104 A1 Apr. 18, 2024

Related U.S. Application Data

(63) Continuation of application No. 17/378,787, filed on Jul. 19, 2021, now Pat. No. 11,903,181.

(30) Foreign Application Priority Data

Jun. 23, 2021 (CN) .......................... 202110697716.1
Jun. 23, 2021 (CN) .......................... 202121406701.7

(51) Int. Cl.
*H10B 12/00* (2023.01)
(52) U.S. Cl.
CPC ......... *H10B 12/09* (2023.02); *H10B 12/0335* (2023.02); *H10B 12/315* (2023.02); *H10B 12/34* (2023.02)

(58) Field of Classification Search
CPC ....... H10B 12/09; H10B 12/315; H10B 12/34
See application file for complete search history.

(56) References Cited

U.S. PATENT DOCUMENTS

| 5,541,434 | A | 7/1996 | Nicholls | |
|---|---|---|---|---|
| 10,141,200 | B2* | 11/2018 | Byun | H01L 21/764 |
| 2002/0060334 | A1* | 5/2002 | Shukuri | H10B 12/482 |
| | | | | 257/306 |
| 2002/0149044 | A1* | 10/2002 | Nakanishi | H10D 1/692 |
| | | | | 257/296 |
| 2004/0209429 | A1 | 10/2004 | Lin | |

(Continued)

OTHER PUBLICATIONS

Jhan, the specification, including the claims, and drawings in the U.S. Appl. No. 17/378,789, filed Jul. 19, 2021.

*Primary Examiner* — Steven M Page
(74) *Attorney, Agent, or Firm* — Winston Hsu

(57) ABSTRACT

A semiconductor structure including a substrate, a first dielectric layer disposed on the substrate, a second dielectric layer disposed on the first dielectric layer and in physical contact with the first dielectric layer, an opening on the substrate and having a lower portion through the first dielectric layer and an upper portion through the second dielectric layer, an conductive layer disposed on the second dielectric layer at two sides of the opening and in physical contact with the second dielectric layer, a contact structure disposed in the lower portion of the opening, and a passivation layer covering a top surface of the contact structure, a sidewall of the second dielectric layer, and a sidewall of the conductive layer.

20 Claims, 14 Drawing Sheets

(56) References Cited

U.S. PATENT DOCUMENTS

| | | | |
|---|---|---|---|
| 2007/0037341 A1* | 2/2007 | Rueger | H01L 21/76224 |
| | | | 257/E21.546 |
| 2007/0087538 A1* | 4/2007 | Kim | H10B 41/35 |
| | | | 257/E21.507 |
| 2007/0278559 A1 | 12/2007 | Saito | |
| 2013/0256769 A1 | 10/2013 | Jeong | |
| 2014/0353734 A1* | 12/2014 | Xie | H10D 84/0133 |
| | | | 257/288 |
| 2018/0012775 A1* | 1/2018 | Byun | H01L 21/4885 |
| 2018/0226410 A1* | 8/2018 | Chang | H10B 12/485 |
| 2018/0315759 A1* | 11/2018 | Liao | H10B 12/0335 |
| 2019/0311947 A1* | 10/2019 | Tapily | C23C 16/045 |
| 2022/0085025 A1 | 3/2022 | Lim | |

\* cited by examiner

SEMICONDUCTOR STRUCTURE AND METHOD FOR FORMING THE SAME

CROSS REFERENCE TO RELATED APPLICATIONS

This application is a continuation application of U.S. application Ser. No. 17/378,787, filed on Jul. 19, 2021. The content of the application is incorporated herein by reference.

BACKGROUND OF THE INVENTION

1. Field of the Invention

The present invention relates to a semiconductor structure and method for forming the same. More particularly, the present invention relates to a dynamic random access memory (DRAM) including a memory region and a peripheral region.

2. Description of the Prior Art

Dynamic random access memory (DRAM) is one kind of volatile memory. A DRAM device usually includes a memory region comprising an array of memory cells and a peripheral region comprising control circuits. The control circuits in the peripheral region may address each of the memory cells in the memory region by plural columns of word lines and plural rows of bit lines traversing the memory region and electrically connected to each of the memory cells to perform reading, writing or erasing data. In advanced semiconductor manufacturing, the chip size of a DRAM device may be dramatically scaled down by adopting buried word-line or buried bit-lines architectures, by which the active areas of the memory cells may be arranged at a dense pitch for higher cell density.

During the process of manufacturing a DRAM device, the memory cells and the semiconductor devices of the peripheral circuits are formed integrally through a same manufacturing process. Therefore, it is important to provide peripheral semiconductor devices which are compliable with the manufacturing process of the memory cells.

SUMMARY OF THE INVENTION

It is one objective of the present invention to provide a semiconductor structure and a method for forming the same, wherein the semiconductor structure has a memory region and a peripheral region, and the peripheral region of the semiconductor structure includes a contact structure form by a same manufacturing process for forming the storage node contacts of the memory cells in the memory region. The contact structure provided by the present invention may be used as an interconnecting element of a peripheral circuit in the peripheral region of the semiconductor structure.

According to an embodiment of the present invention, a semiconductor structure is provided. The semiconductor structure includes a substrate, a first dielectric layer disposed on the substrate, a second dielectric layer disposed on the first dielectric layer, wherein a bottommost surface of the second dielectric layer is in physical contact with a topmost surface of the first dielectric layer, an opening on a peripheral region of the substrate and having a lower portion through the first dielectric layer and an upper portion through the second dielectric layer, an conductive layer disposed on the second dielectric layer at two sides of the opening, wherein a bottommost surface of the conductive layer is in physical contact with a topmost surface of the second dielectric layer, a contact structure disposed in the lower portion of the opening, and a passivation layer covering a top surface of the contact structure, a sidewall of the second dielectric layer, and a sidewall of the conductive layer.

According to another embodiment of the present invention, a semiconductor structure is provided. The semiconductor structure includes a substrate, a contact structure disposed on the substrate, a first dielectric layer disposed on the substrate at two sides of the contact structure, a second dielectric layer disposed on the first dielectric layer at two sides of the contact structure, an conductive layer disposed on the second dielectric layer at two sides of the contact structure, wherein a bottommost surface of the conductive layer is higher than a topmost surface of the contact structure, and a passivation layer covering a top surface of the contact structure, a sidewall of the second dielectric layer, and a sidewall of the conductive layer.

According to still another embodiment of the present invention, a semiconductor structure is provided. The semiconductor structure includes a substrate, a first dielectric layer disposed on the substrate, a second dielectric layer disposed on the first dielectric layer, an opening on a peripheral region of the substrate and having a lower portion through the first dielectric layer and an upper portion through the second dielectric layer, an conductive layer disposed on the second dielectric layer at two sides of the opening, a contact structure disposed in the lower portion of the opening, and a passivation layer in physical contact with a top surface of the contact structure, a sidewall of the second dielectric layer, and a sidewall of the conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
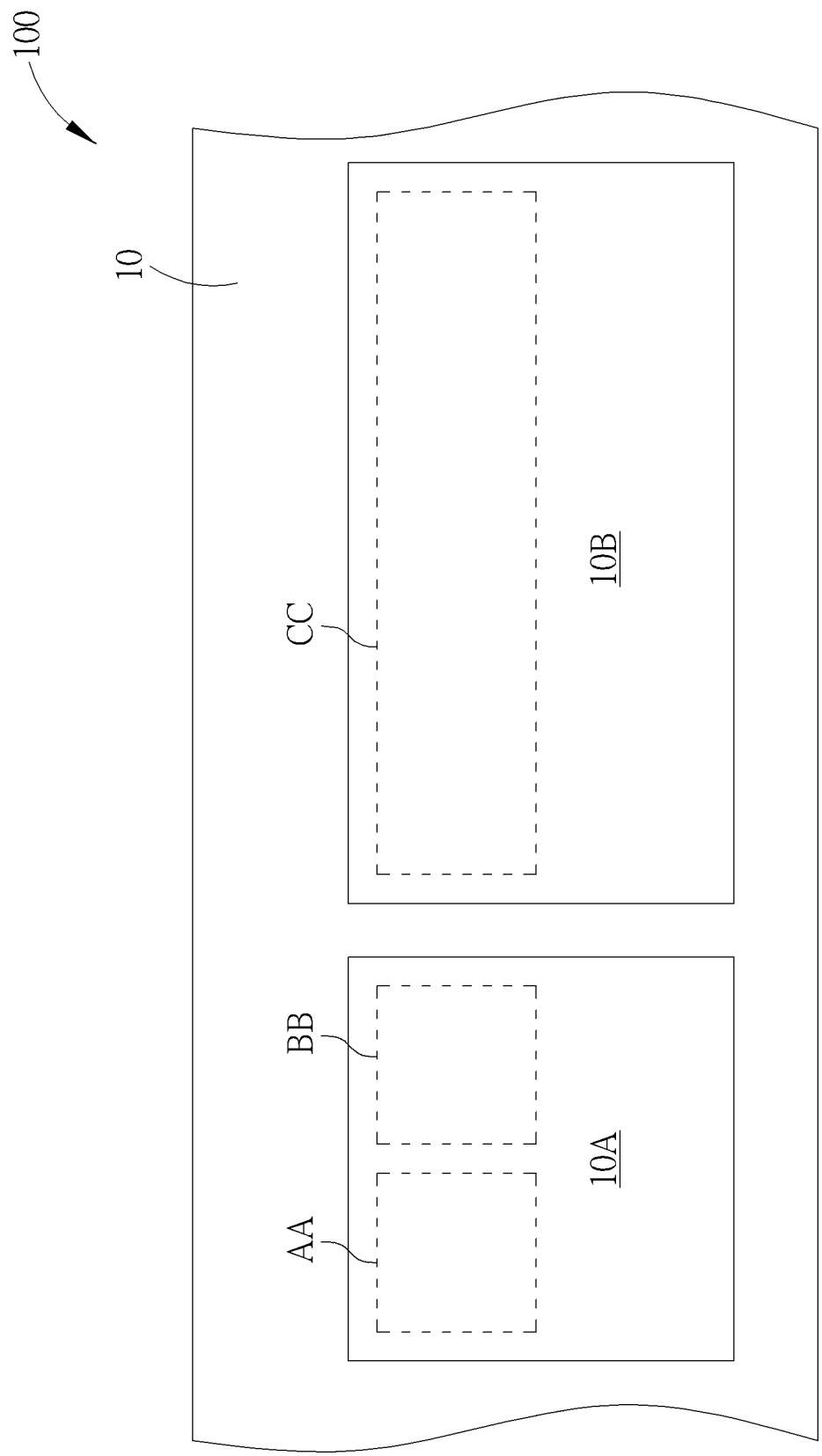
FIG. 1 is a schematic top plan view of a semiconductor structure according to one embodiment of the present invention.

FIG. 1 is a schematic top plan view of a semiconductor structure 100 according to one embodiment of the present invention. As shown in FIG. 1, the semiconductor structure 100 includes a substrate 10 having a peripheral region 10A and a memory region 10B defined thereon. The shapes and arrangements of the peripheral region 10A and the memory region 10B shown in FIG. 1 are only examples for the purpose of illustration, and should not be limitations to the present invention.

The peripheral region 10A may include peripheral circuits that control operations and input/out-put of the memory cells in the memory region 10B, such as drivers, buffers, amplifiers, and decoders, but are not limited thereto. The peripheral region 10A may also include circuits for repairing defective memory cells, such as fuse circuits. As shown in FIG. 1, the peripheral region 10A may include different regions having different types of circuits, such as region AA and region B. The memory region 10B may include a region CC having an array of memory cells, for example, DRAM cells. The semiconductor devices of the peripheral circuits in the peripheral region 10A and the DRAM cells in the memory region 10B are integrally formed on the substrate 10 by a same manufacturing process.

FIG. 2 to FIG. 10 are schematic diagrams illustrating successive steps of a method for forming the semiconductor structure 100 according to a first embodiment of the present invention. The semiconductor structure 100 shown in FIG. 2 to FIG. 10 may have a substrate and peripheral region and a memory region as shown in FIG. 1. The left portions of FIG. 2 to FIG. 10 are cross-sectional views of the region AA of the peripheral region of the semiconductor structure 100. The middle portions of FIG. 2 to FIG. 10 are cross-sectional views of the region BB of the peripheral region of the semiconductor structure 100. The right portions of FIG. 2 to FIG. 10 are cross-sectional views of the region CC of the memory region of the semiconductor structure 100.

Figure 2:
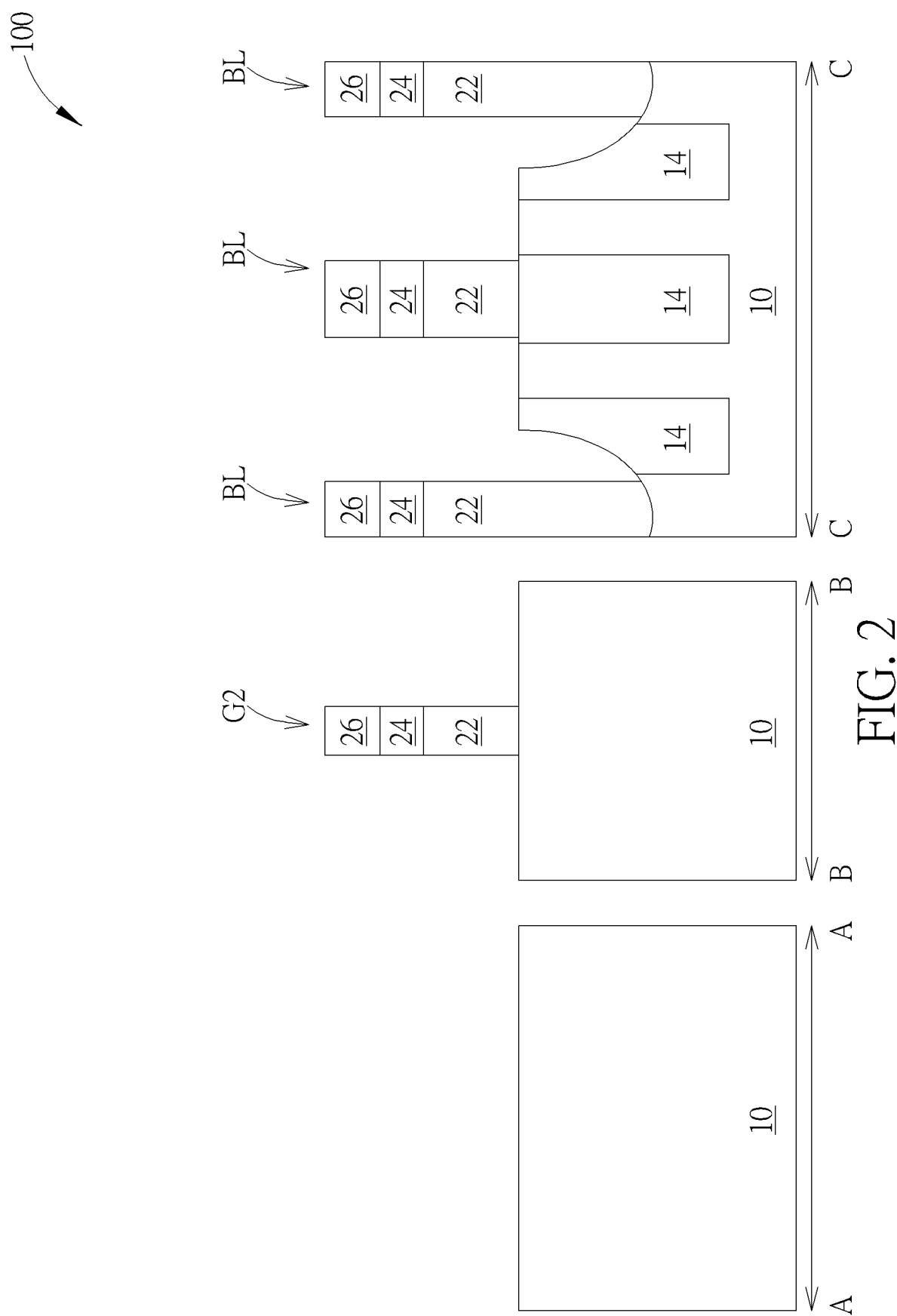
FIG. 2 to FIG. 10 are schematic diagrams illustrating successive steps of a method for forming the semiconductor structure according to a first embodiment of the present invention.

Please refer to FIG. 2, a substrate 10 is provided. A plurality of isolation structures 14 such as shallow trench isolations (STI) are formed in the substrate 10 to define a plurality of active regions of the semiconductor devices (not shown) in the peripheral region 10A of the substrate 10 and a plurality of active regions (not shown) of the memory cells (not shown) in the memory region 10B of the substrate 10. Furthermore, a plurality of buried word lines (not shown) may be formed in the substrate 10 and cut through the active regions (not shown) of the memory cells.

As shown in FIG. 2, a gate structure G2 and a plurality of bit lines BL are formed on the peripheral region 10A and the memory region 10B of the substrate 10 at the same time by the same manufacturing process. For example, a semiconductor material layer (not shown), a metal material layer (not shown), and a hard mask material layer (not shown) may be successively formed on the peripheral region and the memory region of the substrate 10. After that, a patterning process such as a photolithography-etching process may be performed to pattern the hard mask material layer, and a subsequent etching process using the patterned hard mask material layer as an etching mask may be performed to etch and remove the unnecessary portions of the semiconductor material layer and the metal material layer, such that the gate structure G2 and the bit lines BL may be obtained.

As shown in FIG. 2, the gate structure G2 and the bit lines BL respectively include a semiconductor portion 22, a metal portion 24 on the semiconductor portion 22, and a hard mask portion 26 on the metal portion 24. According to an embodiment, the semiconductor portion 22 may include polysilicon. The metal portion 24 may include aluminum (Al), tungsten (W), copper (Cu), titanium (Ti), titanium aluminum alloy (TiAl), or other low-resistivity metal materials. The hard mask portion 26 may include silicon nitride (SiN), silicon oxynitride (SiON), silicon carbon nitride (SiCN), or other dielectric materials. A gate dielectric layer (not shown) may be disposed between the substrate 10 and the semiconductor portions 22 of the gate structures G2.

Figure 3:
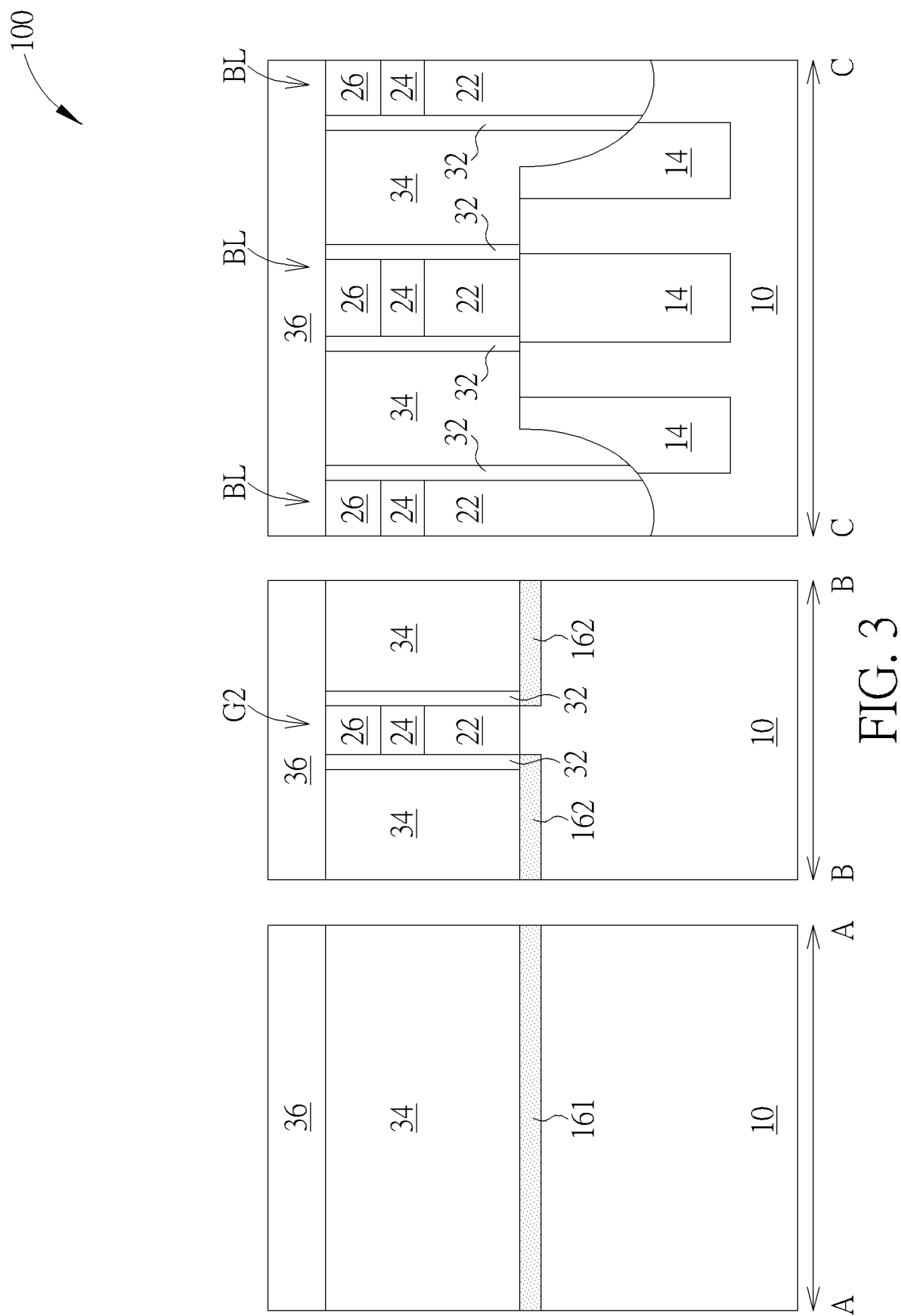

Please refer to FIG. 3. Subsequently, the spacers 32 may be formed on sidewalls of the gate structures G2 and the bit lines BL, and the doped region 161 and the doped regions 162 may be formed in the active regions (not shown) of the peripheral region 10A of the substrate 10. The positions of the doped region 161 and the doped regions 162 shown in FIG. 3 are examples and should not be taken as limitations to the present invention. After that, a first dielectric layer 34 may be formed on the substrate 10, and a planarization process may be carried out to remove a portion of the first dielectric layer 34 until the top surfaces of the gate structure G2 and the bit lines BL are exposed. After that, a second dielectric layer 36 is formed on the first dielectric layer 34 and covering the exposed top surfaces of the gate structure G2 and the bit lines BL. According to an embodiment, the materials of the first dielectric layer 34 and the second dielectric layer 36 may include silicon oxide ($SiO_2$), silicon nitride (SiN), silicon oxynitride (SiON), silicon carbon nitride (SiCN), or other dielectric materials. According to an embodiment, the first dielectric layer 34 may include silicon oxide ($SiO_2$), and the second dielectric layer 36 may include silicon nitride (SiN), but is not limited thereto.

According to an embodiment, the spacers 32 are formed by depositing at least a spacer material layer (not shown) on the substrate 10 and conformally cover the top surfaces and sidewalls of the gate structure G2 and the bit lines BL. An etching process such as a dry etching process may be performed to anisotropically etch and remove the unnecessary portions of the spacer material layer, and the remaining portions of the spacer material layer on the sidewalls of the gate structure G2 and the bit lines BL become the spacers 32. The material of the spacers 32 may include silicon nitride (SiN), silicon oxynitride (SiON), silicon carbon nitride (SiCN), or other dielectric materials. According to an embodiment, the spacers 32 may respectively have a single-layered structure or a multi-layered structure.

Figure 4:
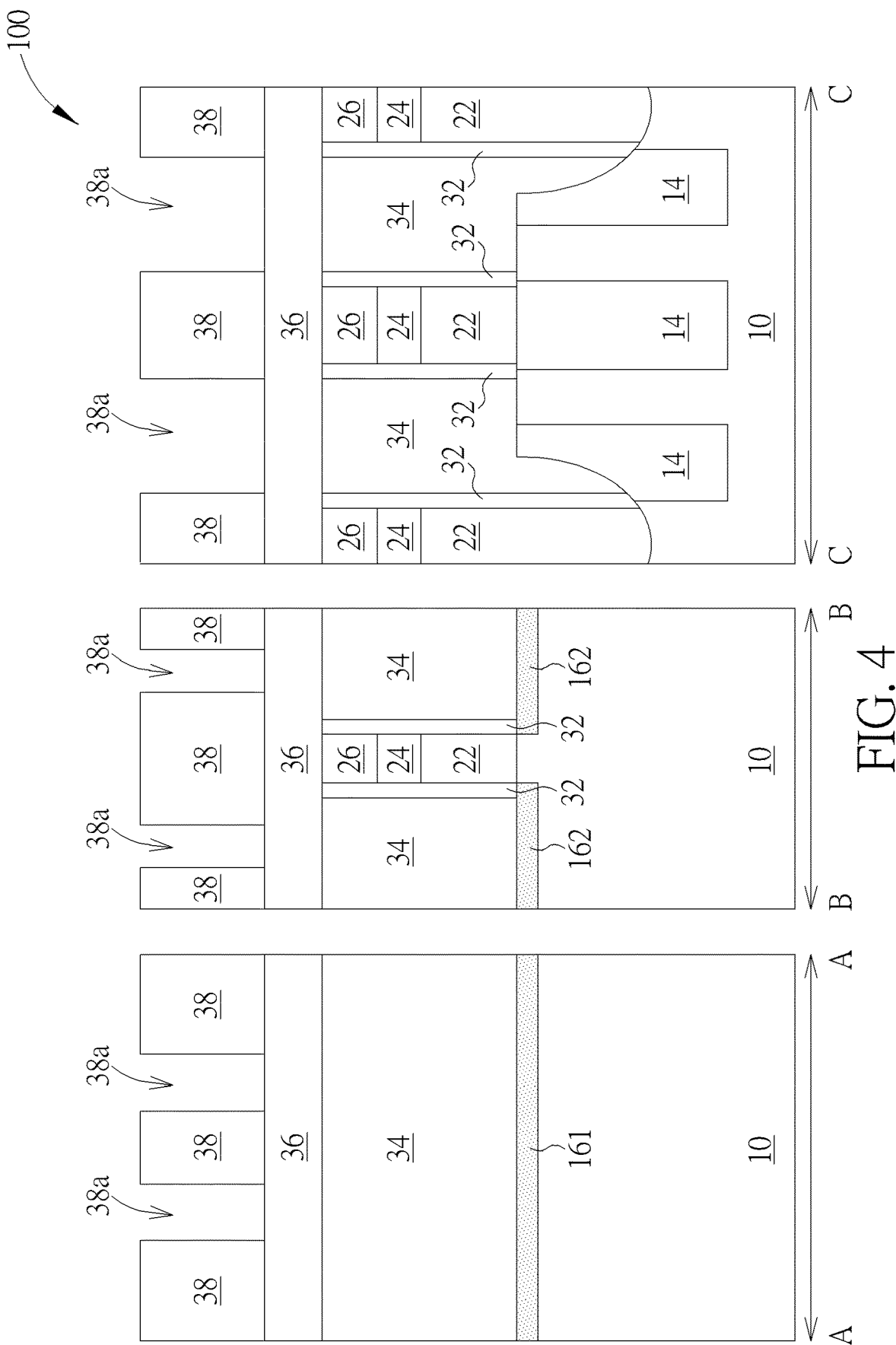

Please refer to FIG. 4. Subsequently, a patterned mask layer 38 may be formed on the second dielectric layer 36. The patterned mask layer 38 includes a plurality of mask openings 38a that expose predetermined portions of the second dielectric layer 36.

Figure 5:
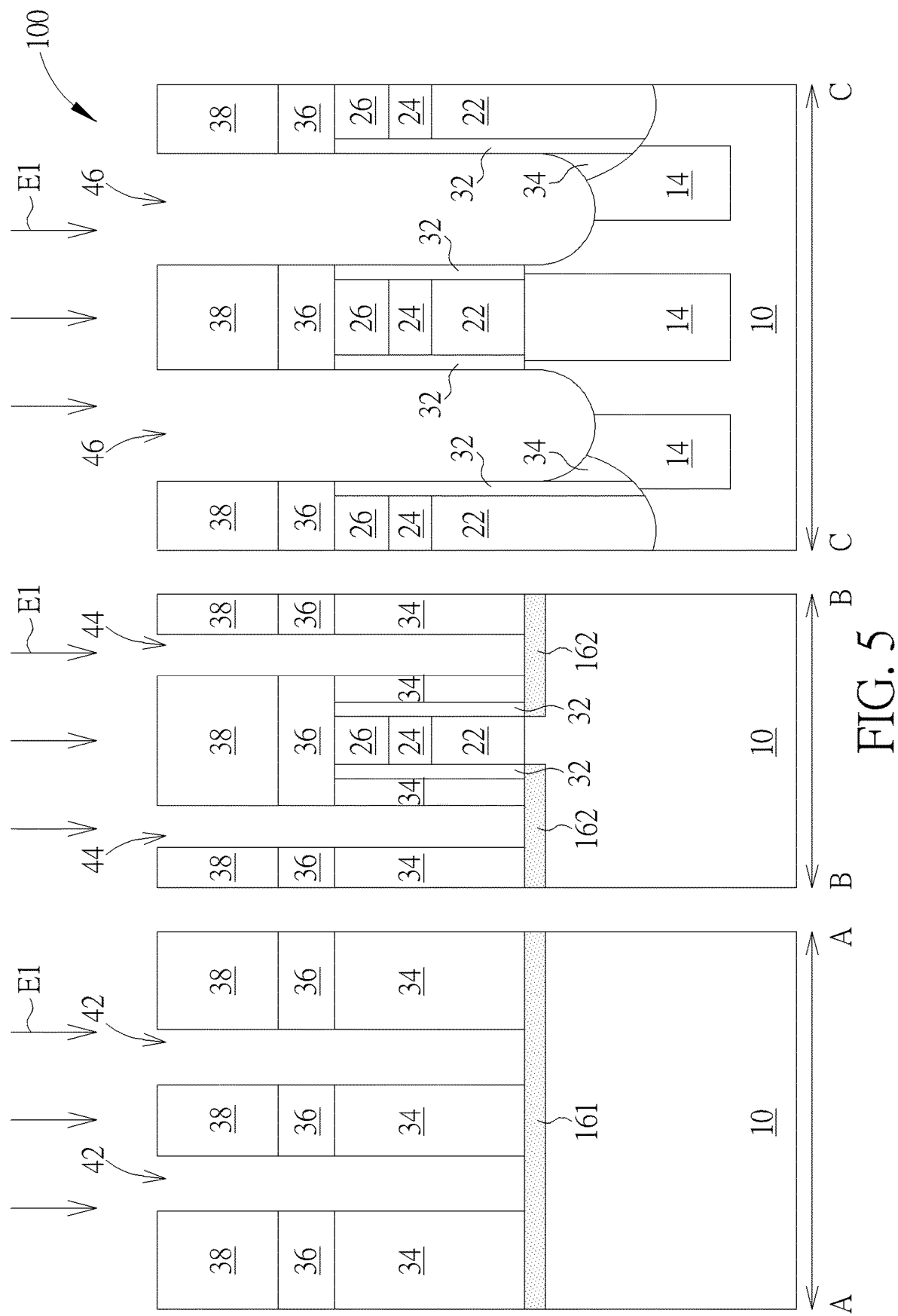

Please refer to FIG. 5. Subsequently, a contact etching process E1 such as a dry etching process is performed, using the patterned mask layer 38 as an etching mask to etch and remove the exposed portions of the second dielectric layer 36 and the first dielectric layer 34, thereby forming the first contact openings 42, the second contact openings 44, and the storage node contact openings 46. The first contact openings 42 are on the region AA of the peripheral region 10A of the substrate 10 and through the second dielectric layer 36 and the first dielectric layer 34 to expose portions of the doped region 161 in the substrate 10. The second contact openings 44 are on the region BB of the peripheral region 10A of the substrate 10 and through the second dielectric layer 36 and the first dielectric layer 34 to expose portions of the doped region 162 at two sides of the gate structure G2. The storage node contact openings 46 are on the region CC of the memory region 10B of the substrate 10 and through the second dielectric layer 36 and the first dielectric layer 34 between the bit lines BL to expose portions of the active regions (not shown) of the memory cells.

Figure 6:
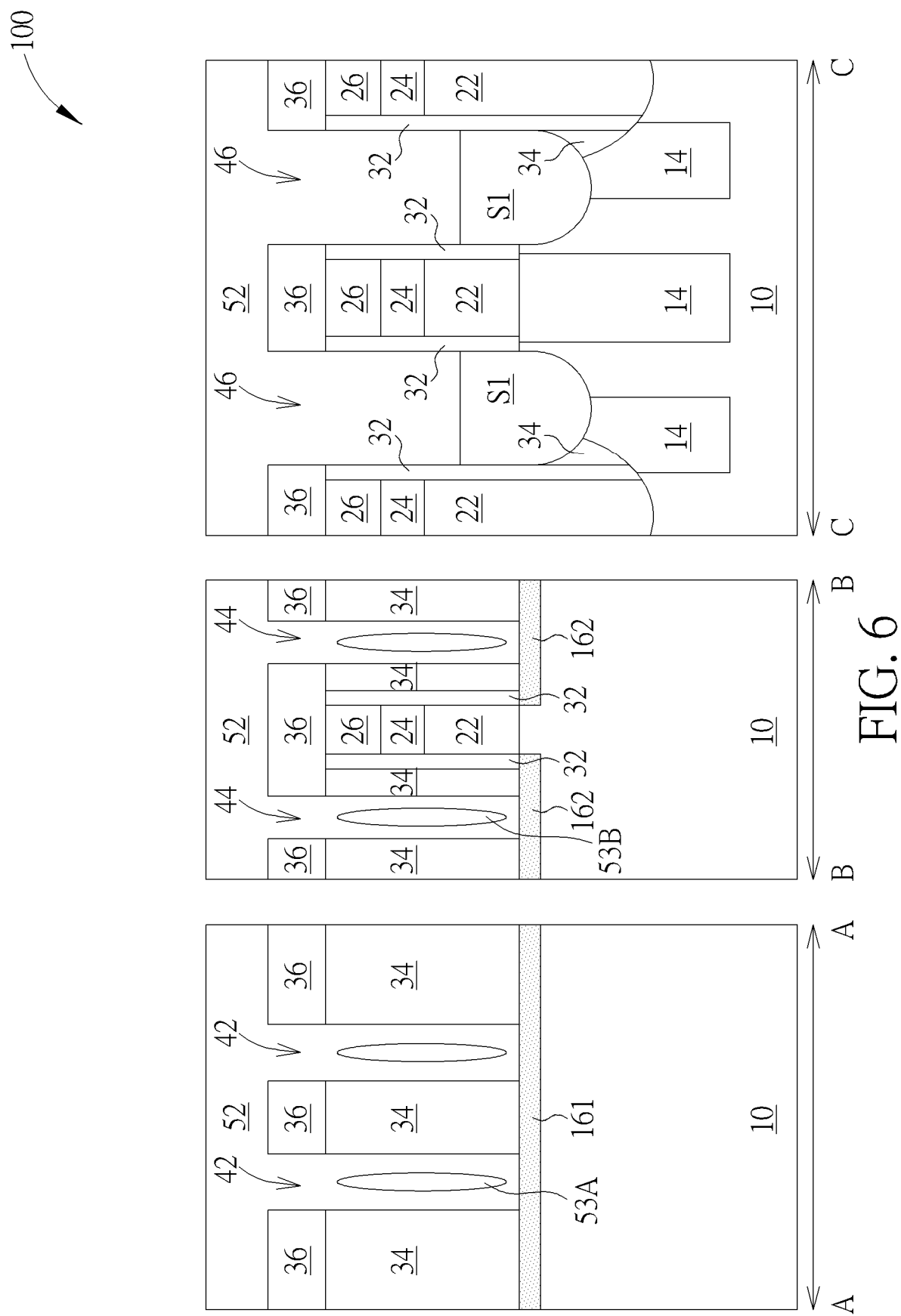

Please refer to FIG. 6. After removing the patterned mask layer 38, semiconductor portions S1 may be selectively formed on the exposed active regions (not shown) of the memory cells and fill the lower portions of the storage node contact openings 46. Subsequently, a conductive layer 52 may be formed on the second dielectric layer 36 and fills the first contact openings 42, the second contact openings 44, and the storage node contact openings 46. The conductive layer 52 may include a metal, for example, tungsten (W). According to an embodiment, as shown in FIG. 6, when the widths of the first contact openings 42 and the second contact openings 44 are small and/or by controlling the gap-fill capability of the conductive layer 52, the conductive layer 52 may seal an air gap 53A in the first contact openings 42 and may also seal an air gap 53B in the second contact openings 44.

Figure 7:
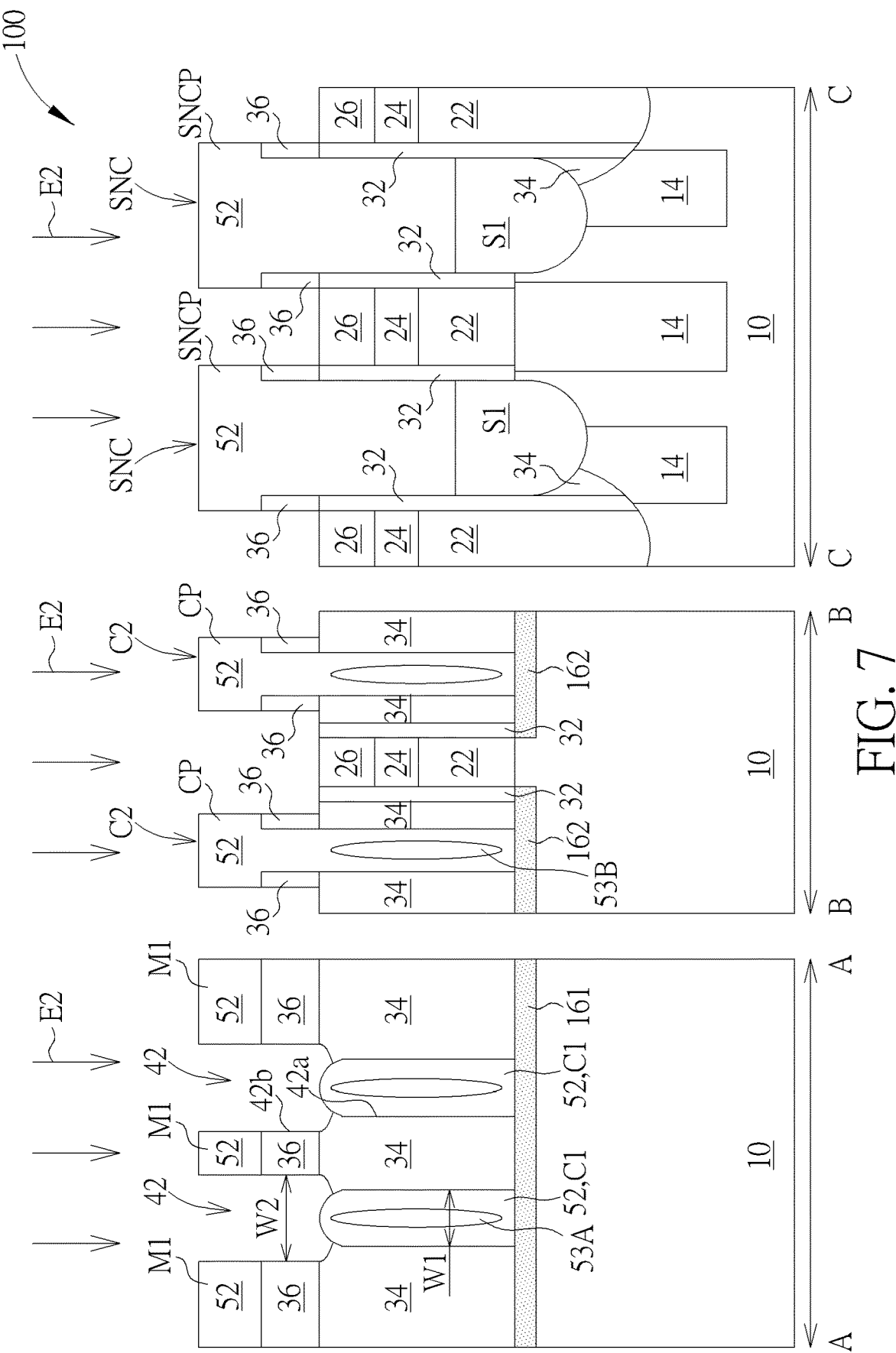

Please refer to FIG. 7. Subsequently, after forming another patterned mask layer (not shown) on the conductive layer 52 to cover pre-determined portions of the conductive layer 52, a recessing process E2 may be performed, using the patterned mask layer (not shown) as an etching mask to etch and pattern the conductive layer 52 on the second dielectric layer 36 and also remove a portion of the conductive layer 52 in the upper portions 42b of the first contact openings 42, thereby simultaneously forming the contact structures C1 in the lower portions 42a of the first contact openings 42, the contact structures C2 in the second contact openings 44 and the pad portions CP of the contact structures C2, the storage node contacts SNC in the storage node contact openings 46 and the pad portions SNCP of the storage node contacts SNC, and the interconnecting structures M1 disposed on the second dielectric layer 36 at two sides of the first contact openings 42. It is noteworthy that portions of the second dielectric layer 36 exposed from the upper portion 42b of the first contact openings 42 may also be removed during the recessing process E2. Therefore, as shown in FIG. 7, a width W2 of the upper portion 42b of the first contact opening 42 is larger than a width W1 of the lower portion 42a of the first contact opening 42 after the recessing process E2.

According to an embodiment, as shown in FIG. 7, sidewalls of the interconnecting structures M1 are aligned with sidewalls of the second dielectric layer 36 at two sides of the upper portions 42b of the first contact openings 42.

According to an embodiment, a portion of the first dielectric layer 34 may be over-etched and removed during the recessing process E2, and the upper portions 42b of the first contact openings 42 may expose concave sidewalls of the first dielectric layer 34. Because of different etching rates between the first dielectric layer 34 and the conductive layer 52, top surfaces of the contact structures C1 may protrude from the concave sidewalls of the first dielectric layer 34. According to an embodiment, after the recessing process E2, the air gaps 53A may be still sealed in the conductive layer 52 in the first contact openings 42.

Please still refer to FIG. 7. The pad portions CP of the contact structures C2 protrude from the second contact openings 44 and extend laterally to cover portions of the second dielectric layer 36 at two sides of the second contact openings 44. The pad portions SNCP of the storage node contacts SNC protrude from the storage node contact openings 46 and extend laterally to cover portions of the second dielectric layer 36 at two sides of the storage node contact openings 46. According to an embodiment, the portions of the second dielectric layer 36 not covered by the interconnecting structures M1, the pad portions CP of the contact structures C2, and the pad portions SNCP of the storage node contacts SNC are removed during the recessing process E2, and portions of the upper surface of the first dielectric layer 34 around the second contact openings 44 may be exposed. According to an embodiment, the exposed portions of the first dielectric layer 34 around the second contact openings 44 may have concave profiles.

Figure 8:
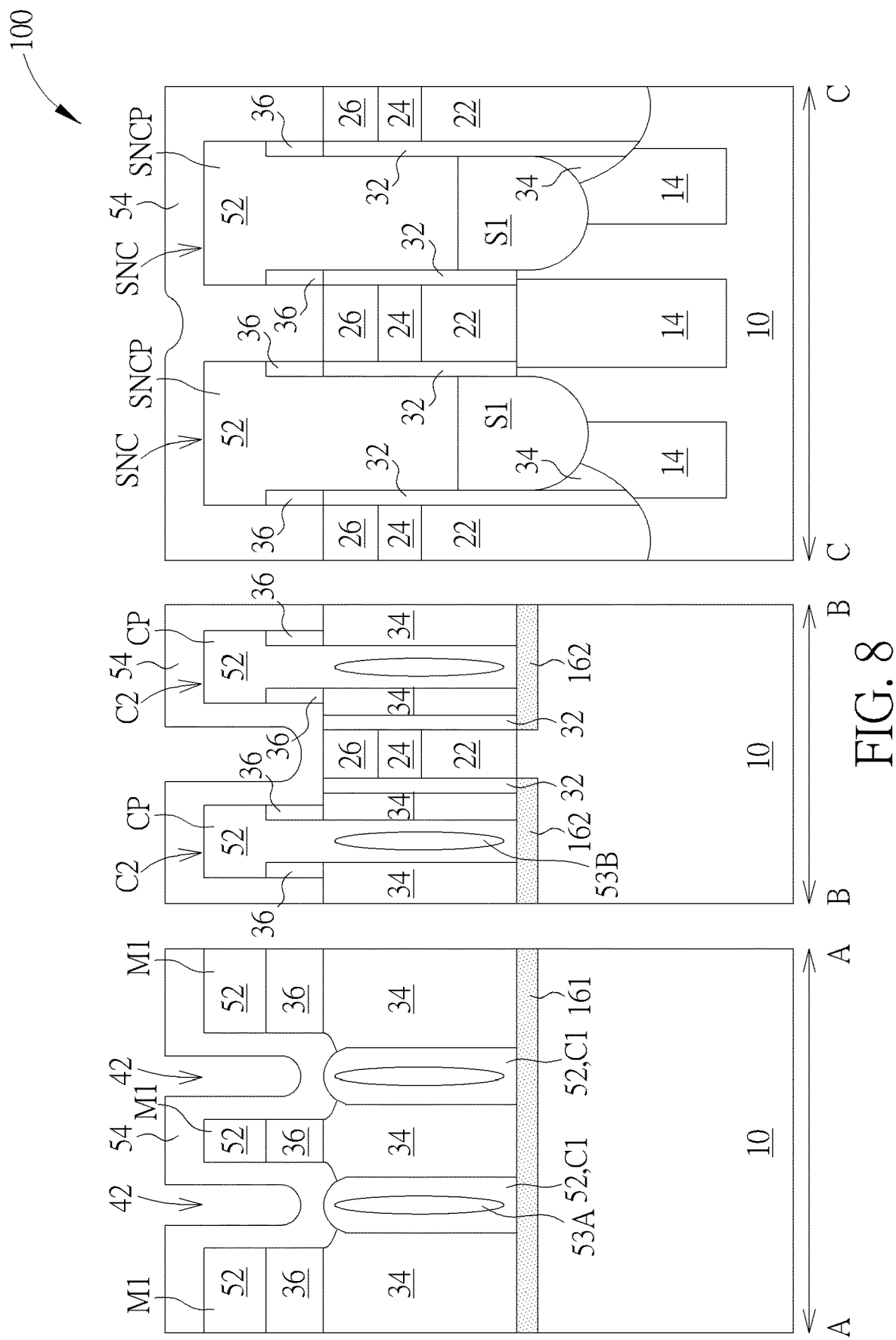

Please refer to FIG. 8. Subsequently, a passivation layer 54 is formed on the substrate 10 and covers the top surfaces of the contact structures C1, the interconnecting structures M1, the pad portions CP of the contact structures C2, and the pad portions SNCP of the storage node contacts SNC. According to an embodiment, the passivation layer 54 may include silicon nitride (SiN).

Figure 9:
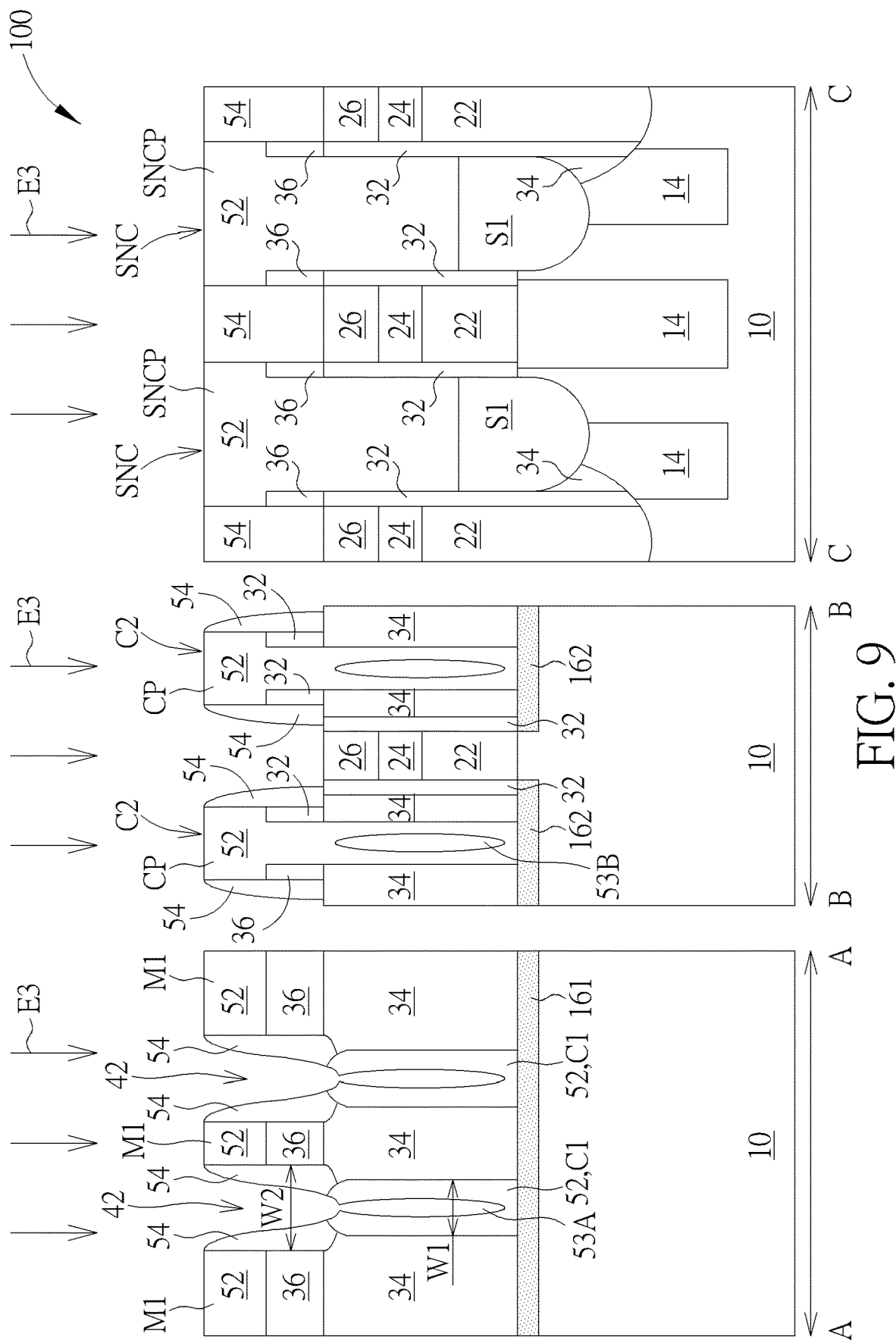

Please refer to FIG. 9. Subsequently, an etching process E3 such as an anisotropic dry etching process may be performed to remove a portion of the passivation layer 54 until the top surfaces of the interconnect structures M1, the top surfaces of the pads portions CP of the contact structures C2, and the top surfaces of the pad portions SNCP of the storage node contacts SNC are exposed.

It is noteworthy that, after the etching process E3, as shown in the left portion of FIG. 9, portions of the remaining passivation layer 54 may become spacers that cover the top surfaces of the contact structures C1 and sidewalls of the second dielectric layer 36 exposed from the upper portion 42b of the first contact openings 42, and sidewalls of the interconnect structures M1. According to an embodiment, the etching process E3 may further remove portions of the contact structures C1 such that portions of the top surfaces of the contact structures C1 and the air gaps 53A in the contact structures C1 may be exposed from the passivation layer 54.

It is also noteworthy that, after the etching process E3, as shown in the middle portion of FIG. 9, portions of the remaining passivation layer 54 may become spacers that cover sidewalls of the pad portions CP of the contact structures C2 and sidewalls of the second dielectric layer 36 under the pad portions CP. The hard mask portion 26 of the gate structure G2 and a surface of the first dielectric layer 34 may be exposed from the passivation layer 54. As shown in the right portion of FIG. 9, portions of the remaining passivation layer 54 may fill the spaces between the pad portions SNCP of the storage node contacts SNC and completely cover the hard mask portion 26 of the bit lines BL.

Figure 10:
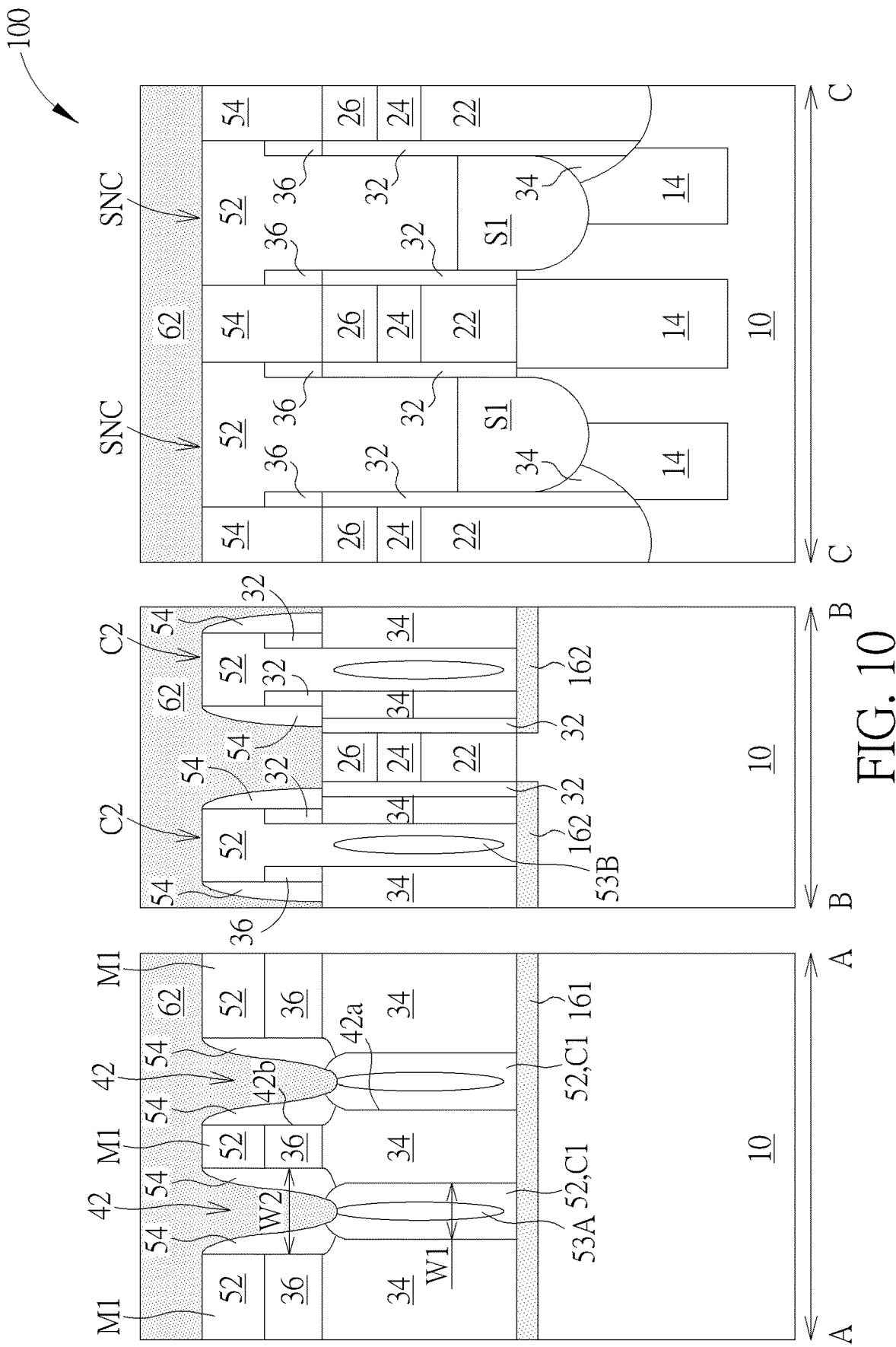

Please refer to FIG. 10. Subsequently, a third dielectric layer 62 is formed on the interconnect structure M1, the pad portions CP, and the storage node pad portions SNCP, and completely fills the upper portions 42b of the first contact openings 42 and the space between the pad portions CP. The air gaps 53A opened by the etching process E3 are sealed again by the third dielectric layer 62. The material of the third dielectric layer 62 may include silicon oxide ($SiO_2$) or silicon nitride (SiN), but is not limited thereto. In later process steps (not shown), after planarizing the third dielectric layer 62, a plurality of interconnect structure (not shown) may be formed in the third dielectric layer 62 to electrically connect to the contact structure C1, the pad portions CP of the contact structures C2, and the pad portions SNCP of the storage node contacts SNC.

In light of the above, the semiconductor structure 100 provided by the present invention includes a substrate 10, a first dielectric layer 34 disposed on the substrate 10, a second dielectric layer 36 disposed on the first dielectric layer 34, an opening (the first contact opening) 42 on the substrate 10 and having a lower portion 42a through the first dielectric layer 34 and an upper portion 42b through the second dielectric layer 36, an interconnecting structure M1 disposed on the second dielectric layer 36 at two sides of the opening (the first contact opening) 42, a contact structure C1 disposed in the lower portion 42a of the opening (the first contact opening) 42, and a passivation layer 54 covering a top surface of the contact structure C1, a sidewall of the second dielectric layer 36, and a sidewall of the interconnecting structure M1.

According to an embodiment, a width W2 of the upper portion 42b of the opening (the first contact opening) 42 is larger than a width W1 of the lower portion 42a of the opening (the first contact opening) 42.

According to an embodiment, a portion of the top surface of the contact structure C1 is exposed from the passivation layer 54.

According to an embodiment, an air gap 53A in the contact structure C1 is exposed from the passivation layer 54.

According to an embodiment, the sidewall of the second dielectric layer 36 and the sidewall of the interconnecting structure M1 are aligned.

According to an embodiment, the passivation layer 54 covers a concave sidewall of the first dielectric layer 34. The top surface of the contact structure C1 may protrudes from the concave sidewall of the first dielectric layer 34.

According to an embodiment, a third dielectric layer 62 is disposed on the interconnecting structure M1 and filling the upper portion 42b of the opening (the first contact opening) 42 and sealing the air gap 53A.

According to an embodiment, a plurality of bit lines BL are disposed on substrate 10, and a plurality of storage node contacts SNC are disposed on the substrate 10 and between the bit lines BL. A top surface of the interconnecting structure M1 is flush with top surfaces of the storage node contacts SNC.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
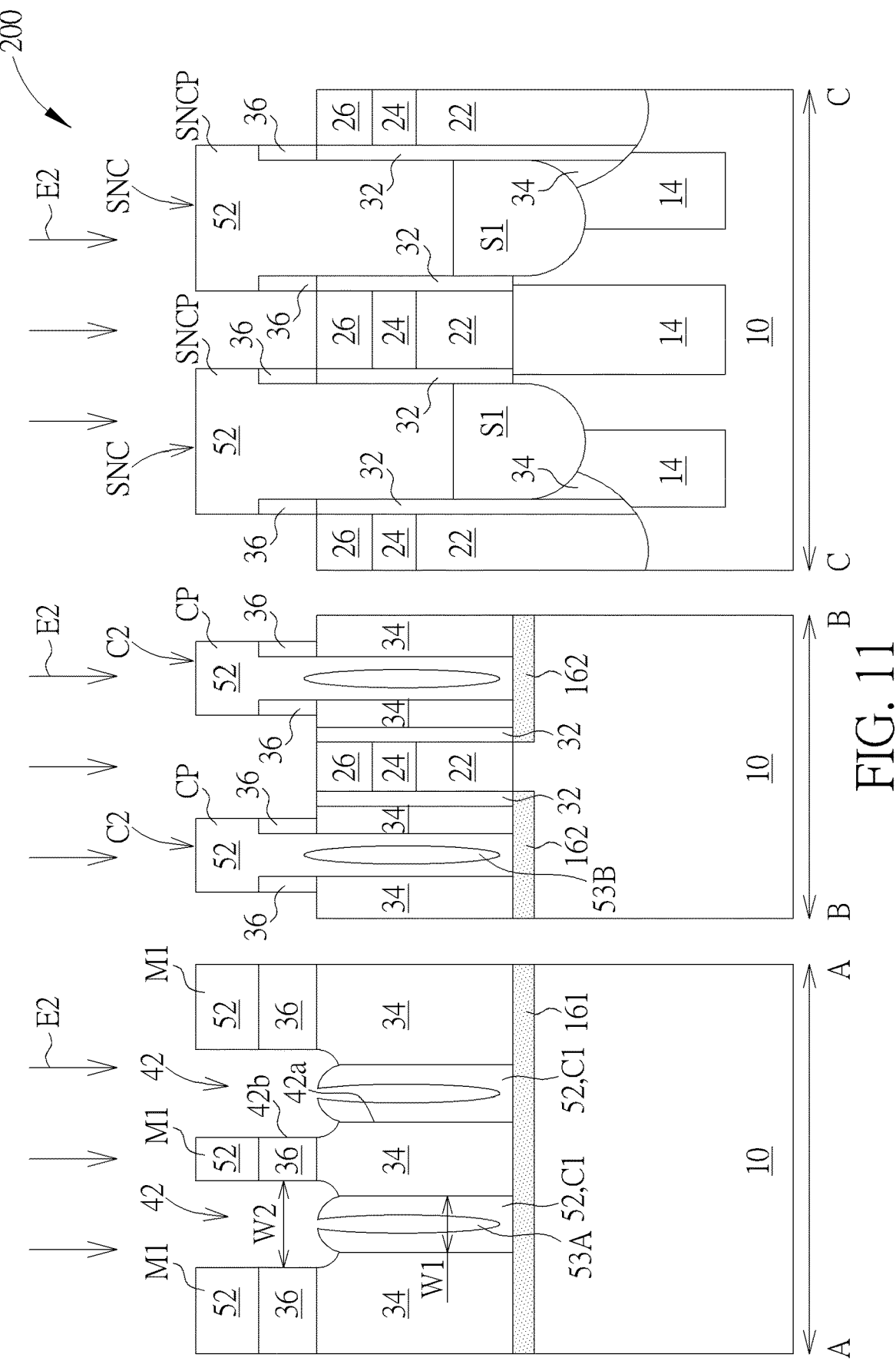
FIG. 11 and FIG. 12 are schematic diagrams illustrating the cross-sectional views of a semiconductor structure according to a second embodiment of the present invention, and are at the process steps corresponding to the steps shown in FIG. 7 and FIG. 8.
Figure 12:
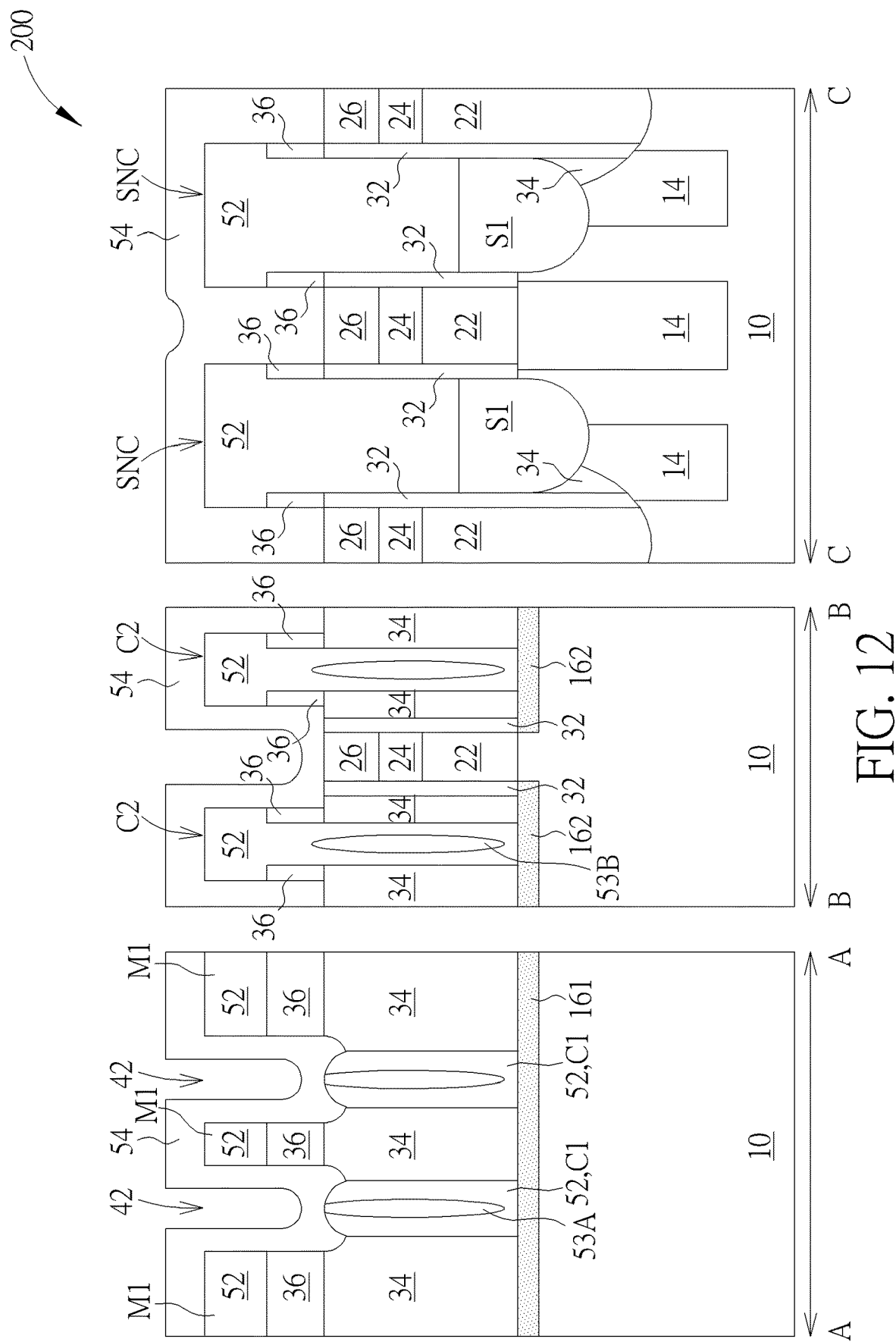

Please refer to FIG. 11 and FIG. 12, which are schematic diagrams illustrating the cross-sectional views of a semiconductor structure 200 at the process steps corresponding to the steps shown in FIG. 7 and FIG. 8 according to a second embodiment of the present invention. A difference between the second embodiment and the first embodiment is that, depending on the positions of the top portions of the air gaps 53A and/or the over-etched thickness of the first dielectric layer 34 during the recessing process E2, the air gaps 53A in the contact structures C1 may be opened after the recessing process E2. As shown in FIG. 12, the air gaps 53A may be sealed again by the passivation layer 54, and then re-opened by the etching process E3 (see FIG. 9).

Figure 13:
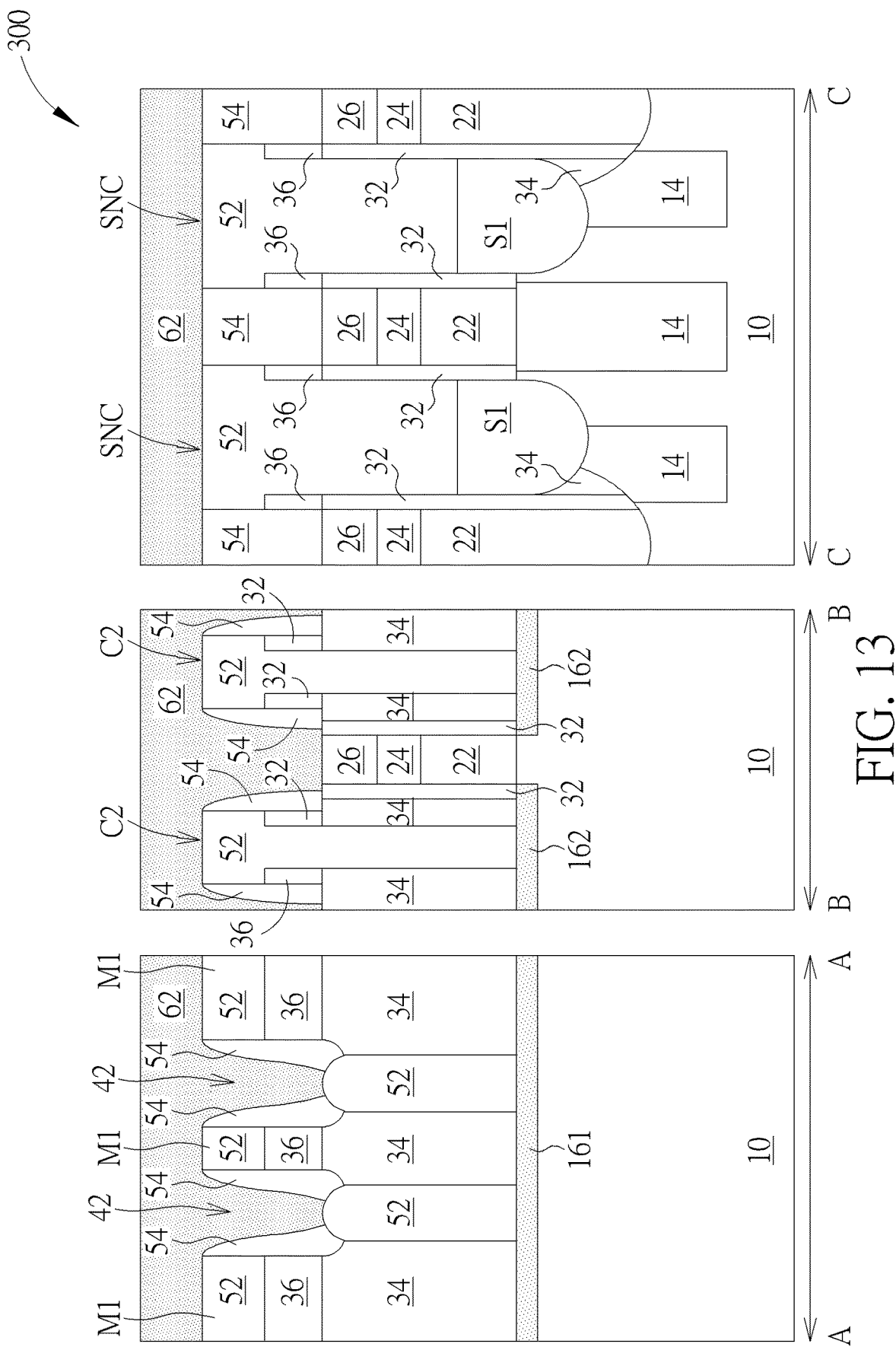
FIG. 13 is a schematic diagram illustrating the cross-sectional views of a semiconductor structure according to a third embodiment of the present invention, and is at the process step corresponding to the step shown in FIG. 10.

Please refer to FIG. 13, which is a schematic diagram illustrating the cross-sectional views of a semiconductor structure 300 at the process step corresponding to the step shown in FIG. 10 according to a third embodiment of the present invention. A difference between the third embodiment and the first embodiment is that, as shown in FIG. 13, the conductive layer 52 may completely fill the first contact openings 42 and the second contact openings 44, without forming air gaps in the first contact openings 42 and the second contact openings 44. Afterward, the passivation layer 54 is formed and covers the top surface of the contact structure C1, the sidewall of the second dielectric layer 36, and the sidewall of the interconnecting structure M1. The third dielectric layer 62 is then disposed on the interconnecting structure M1 and completely fills the opening (the first contact opening) 42.

Figure 14:
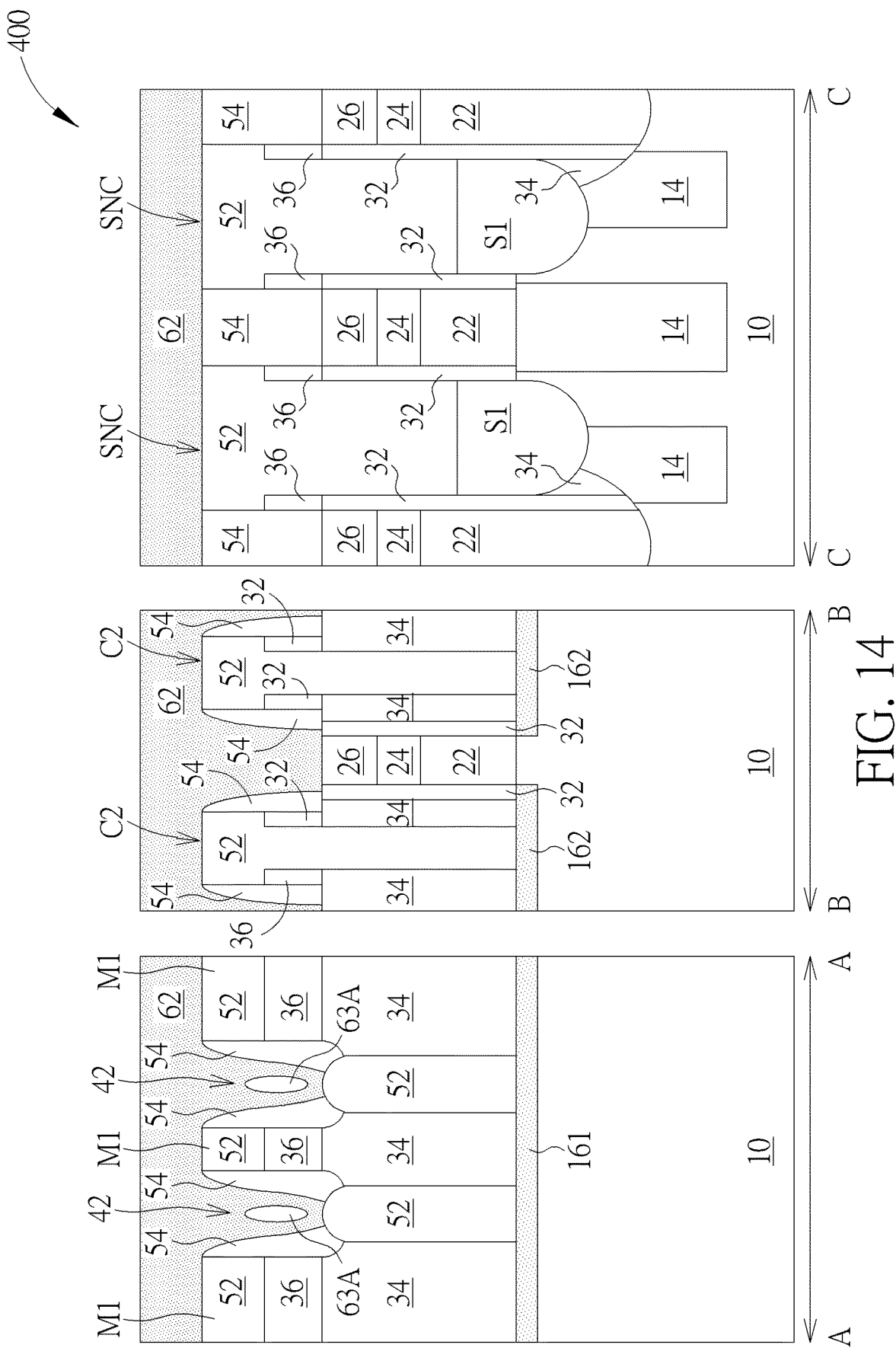
FIG. 14 is a schematic diagram illustrating the cross-sectional views of a semiconductor structure according to a fourth embodiment of the present invention, and is at the process step corresponding to the step shown in FIG. 10.

Please refer to FIG. 14, which is a schematic diagram illustrating the cross-sectional views of a semiconductor structure 400 at the process step corresponding to the step shown in FIG. 10 according to a fourth embodiment of the present invention. The differences between the fourth embodiment and the first embodiment includes that, as shown in FIG. 14, the conductive layer 52 may completely fill the first contact openings 42 and the second contact openings 44, without forming air gaps in the first contact openings 42 and the second contact openings 44, and the third dielectric layer 62 may seal air gaps 63A in the upper portions 42b of the first contact openings 42 and between the remaining portions of the passivation layer 54 (spacers made from passivation layer 54).

In conclusion, the present invention provides a semiconductor structure having a contact structure that is form by a same manufacturing process for forming the storage node contacts of the memory cells in the memory region. The contact structure provided by the present invention may be applied as an interconnecting element of a peripheral circuit in the peripheral region of the semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a first dielectric layer disposed on the substrate;
   a second dielectric layer disposed on the first dielectric layer, wherein a bottommost surface of the second dielectric layer is in physical contact with a topmost surface of the first dielectric layer;
   an opening on a peripheral region of the substrate and having a lower portion through the first dielectric layer and an upper portion through the second dielectric layer;
   an conductive layer disposed on the second dielectric layer at two sides of the opening, wherein a bottommost surface of the conductive layer is in physical contact with a topmost surface of the second dielectric layer;
   a contact structure disposed in the lower portion of the opening; and
   a passivation layer covering a top surface of the contact structure, a sidewall of the second dielectric layer, and a sidewall of the conductive layer.

2. The semiconductor structure according to claim 1, wherein a width of the upper portion of the opening is larger than a width of the lower portion of the opening.

3. The semiconductor structure according to claim 1, wherein a portion of the top surface of the contact structure is exposed from the passivation layer.

4. The semiconductor structure according to claim 1, wherein an air gap in the contact structure is exposed from the passivation layer.

5. The semiconductor structure according to claim 1, wherein the sidewall of the second dielectric layer and the sidewall of the conductive layer are aligned.

6. The semiconductor structure according to claim 1, wherein a portion of the first dielectric layer is exposed between the top surface of the contact structure and the sidewall of the second dielectric layer and covered by the passivation layer.

7. The semiconductor structure according to claim 6, wherein a surface of the portion of the first dielectric layer has a concave profile.

8. The semiconductor structure according to claim 1, further comprising a third dielectric layer disposed on the conductive layer and the passivation layer and filling the upper portion of the opening.

9. The semiconductor structure according to claim 1, further comprising:
a plurality of bit lines disposed on a memory region of the substrate; and
a plurality of storage node contacts disposed on the substrate and between the bit lines, wherein a topmost surface of the conductive layer is flush with top surfaces of the storage node contacts.

10. A semiconductor structure, comprising:
a substrate;
a contact structure disposed on the substrate;
a first dielectric layer disposed on the substrate at two sides of the contact structure;
a second dielectric layer disposed on the first dielectric layer at two sides of the contact structure;
an conductive layer disposed on the second dielectric layer at two sides of the contact structure, wherein a bottommost surface of the conductive layer is higher than a topmost surface of the contact structure; and
a passivation layer covering a top surface of the contact structure, a sidewall of the second dielectric layer, and a sidewall of the conductive layer.

11. The semiconductor structure according to claim 10, wherein a width of the upper portion of the opening is larger than a width of the lower portion of the opening.

12. The semiconductor structure according to claim 10, wherein a portion of the top surface of the contact structure is exposed from the passivation layer.

13. The semiconductor structure according to claim 10, wherein an air gap in the contact structure is exposed from the passivation layer.

14. The semiconductor structure according to claim 10, wherein the sidewall of the second dielectric layer and the sidewall of the conductive layer are aligned.

15. The semiconductor structure according to claim 10, wherein a portion of the first dielectric layer is exposed between the top surface of the contact structure and the sidewall of the second dielectric layer and covered by the passivation layer.

16. The semiconductor structure according to claim 15, wherein a surface of the portion of the first dielectric layer has a concave profile.

17. The semiconductor structure according to claim 10, further comprising a third dielectric layer disposed on the conductive layer and the passivation layer and filling the upper portion of the opening.

18. The semiconductor structure according to claim 10, further comprising:
a plurality of bit lines disposed on a memory region of the substrate; and
a plurality of storage node contacts disposed on the substrate and between the bit lines, wherein a topmost surface of the conductive layer is flush with top surfaces of the storage node contacts.

19. A semiconductor structure, comprising:
a substrate;
a first dielectric layer disposed on the substrate;
a second dielectric layer disposed on the first dielectric layer;
an opening on a peripheral region of the substrate and having a lower portion through the first dielectric layer and an upper portion through the second dielectric layer;
an conductive layer disposed on the second dielectric layer at two sides of the opening;
a contact structure disposed in the lower portion of the opening; and
a passivation layer in physical contact with a top surface of the contact structure, a sidewall of the second dielectric layer, and a sidewall of the conductive layer.

20. The semiconductor structure according to claim 19, wherein a portion of the first dielectric layer is exposed between the top surface of the contact structure and the sidewall of the second dielectric layer and in physical contact with the passivation layer.

* * * * *